(12) United States Patent
Hiramoto et al.

(10) Patent No.: US 10,877,328 B2
(45) Date of Patent: Dec. 29, 2020

(54) DISPLAY DEVICE AND FLEXIBLE WIRING BOARD

(71) Applicant: Japan Display Inc., Tokyo (JP)

(72) Inventors: Koji Hiramoto, Tokyo (JP); Ken Sugiyama, Tokyo (JP); Kosuke Matsubara, Tokyo (JP); Tomoya Tezen, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/270,050

(22) Filed: Feb. 7, 2019

(65) Prior Publication Data

US 2019/0250441 A1 Aug. 15, 2019

(30) Foreign Application Priority Data

Feb. 9, 2018 (JP) .................................. 2018-022321

(51) Int. Cl.
*H05K 1/00* (2006.01)
*G02F 1/1345* (2006.01)
*H05K 1/02* (2006.01)

(52) U.S. Cl.
CPC ........ *G02F 1/1345* (2013.01); *G02F 1/13452* (2013.01); *H05K 1/028* (2013.01); *H05K 2201/10136* (2013.01)

(58) Field of Classification Search
USPC ....................................................... 361/749
See application file for complete search history.

(56) References Cited

U.S. PATENT DOCUMENTS

| 7,779,539 B2* | 8/2010 | Chen ...................... H05K 1/118 29/402.09 |
| 2013/0169890 A1* | 7/2013 | Kuromizu ........... G02F 1/13452 348/790 |
| 2015/0260909 A1 | 9/2015 | Nambu et al. |
| 2016/0306092 A1 | 10/2016 | Yoshida |

FOREIGN PATENT DOCUMENTS

| JP | 2015-176680 A | 10/2015 |
| JP | 2016-207279 A | 12/2016 |

* cited by examiner

*Primary Examiner* — Andargie M Aychillhum
(74) *Attorney, Agent, or Firm* — K&L Gates LLP

(57) ABSTRACT

According to one embodiment, a display device includes a display panel, a case including a bottom plate and a side plate provided on the bottom plate and attached to the display panel, and a flexible wring board including a first end joined to the display panel and extending from the display panel toward the bottom plate while being curved around the side plate. The flexible wring board includes a substrate, a conductive layer on a first surface of the substrate and constituting wires, and a protective layer overlaid on the conductive layer and the substrate and opposed to an outer surface of the case. The flexible wring board includes a curved portion curved along the side plate, and the substrate includes a concavity provided in the curved portion.

12 Claims, 9 Drawing Sheets

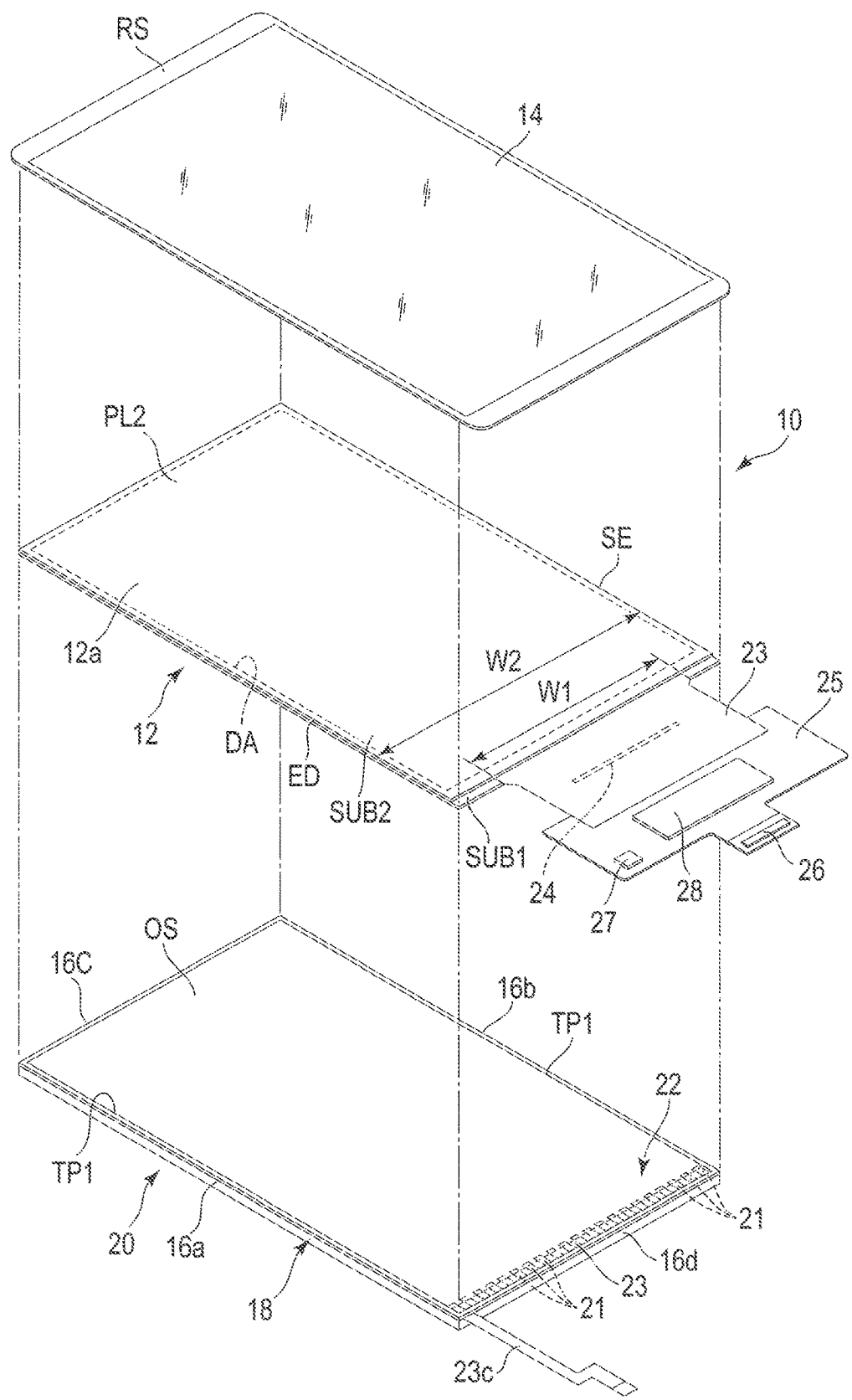
F I G. 3

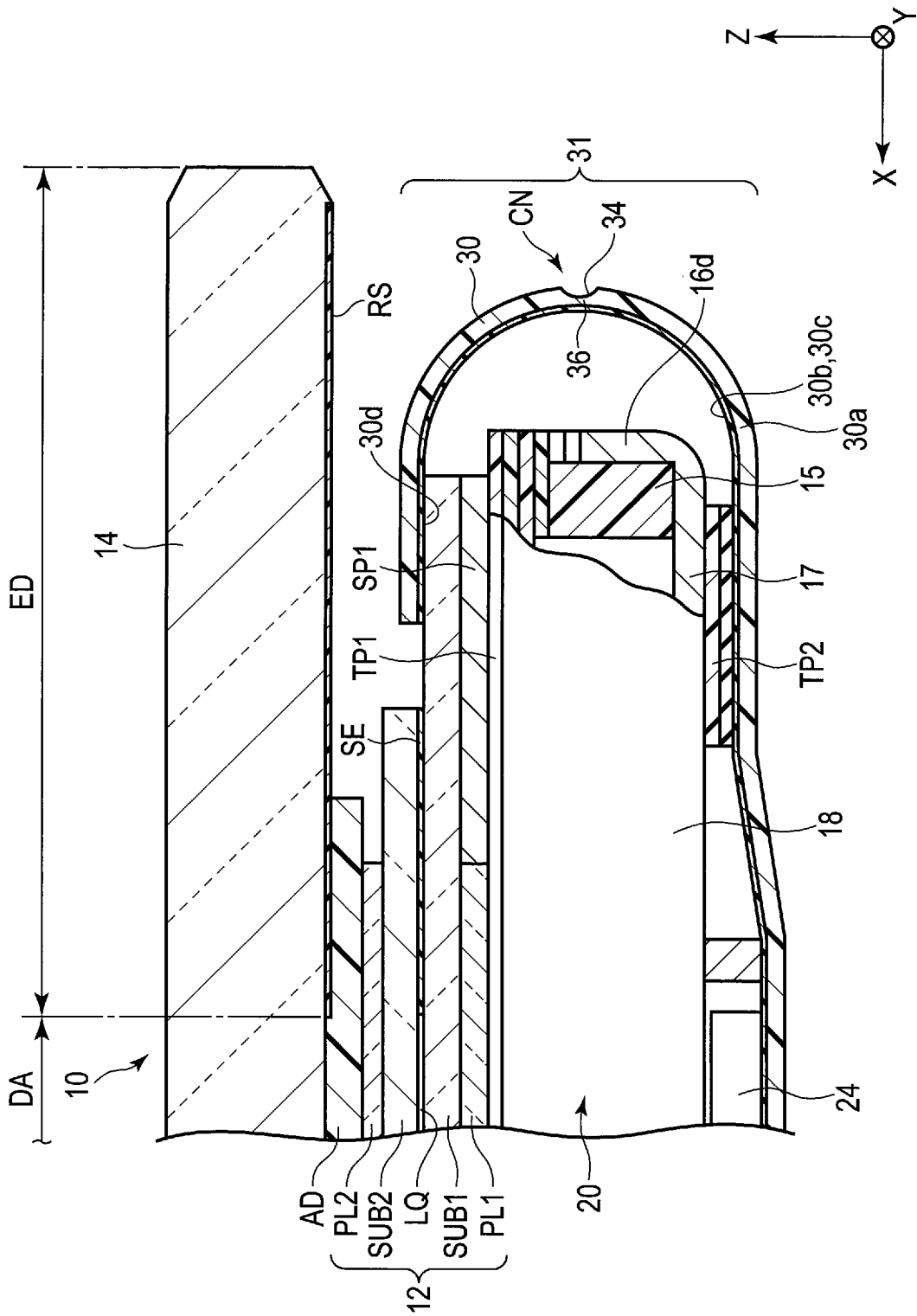
F I G. 4

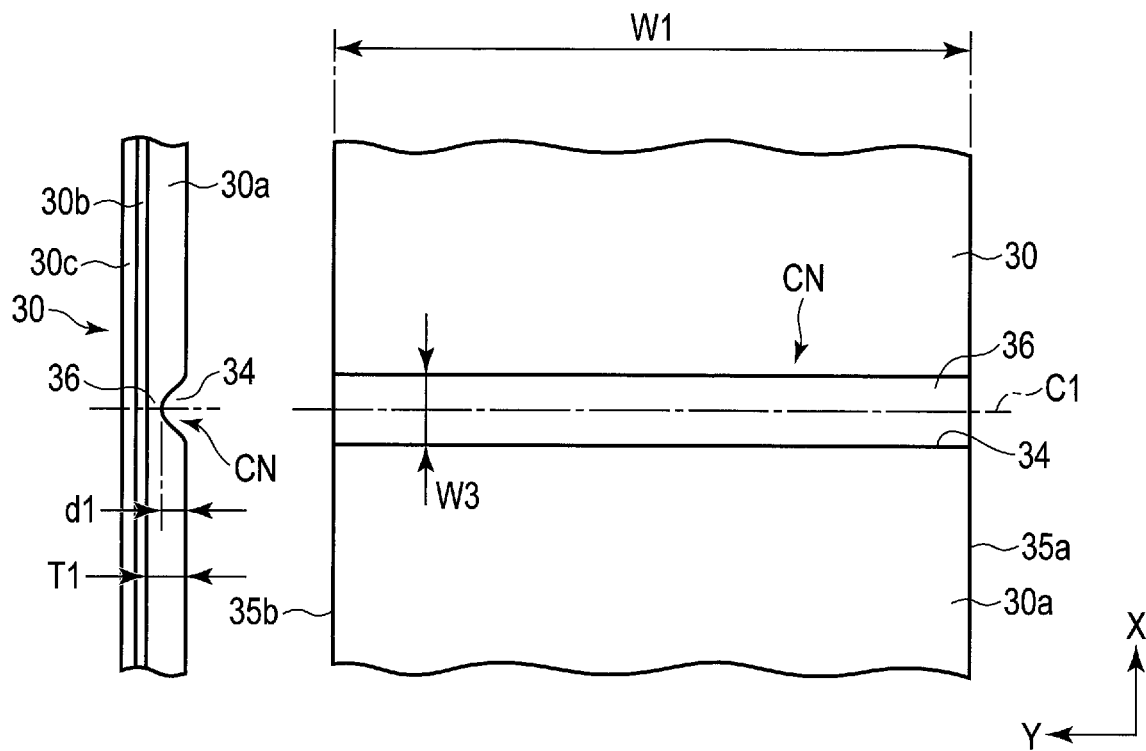
F I G. 5B    F I G. 5A
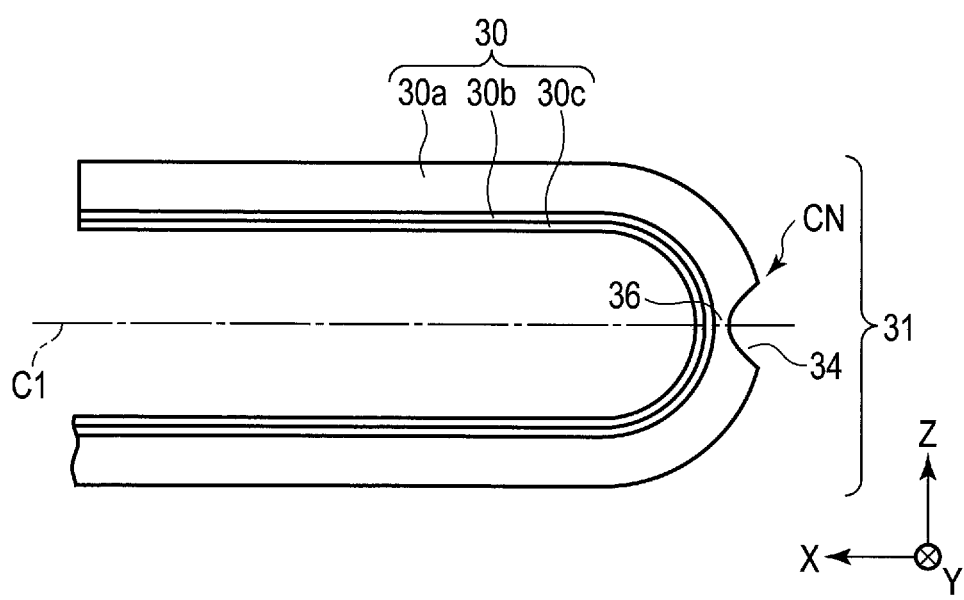
F I G. 6

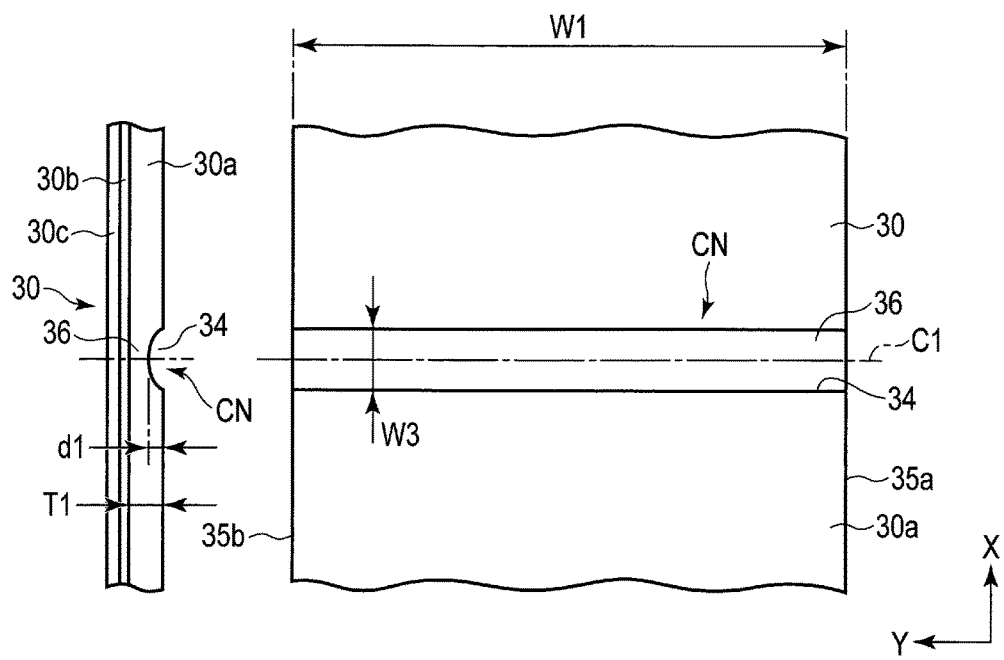
F I G. 7B  F I G. 7A
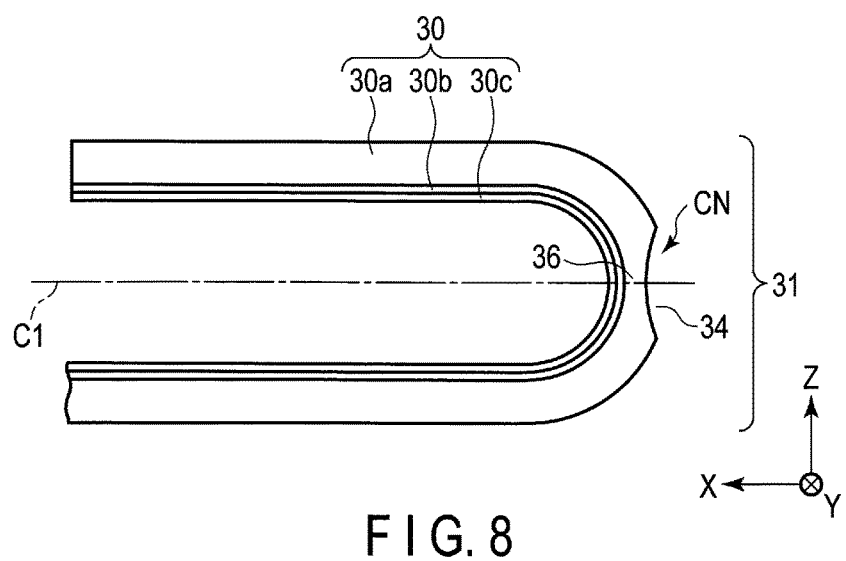
F I G. 8

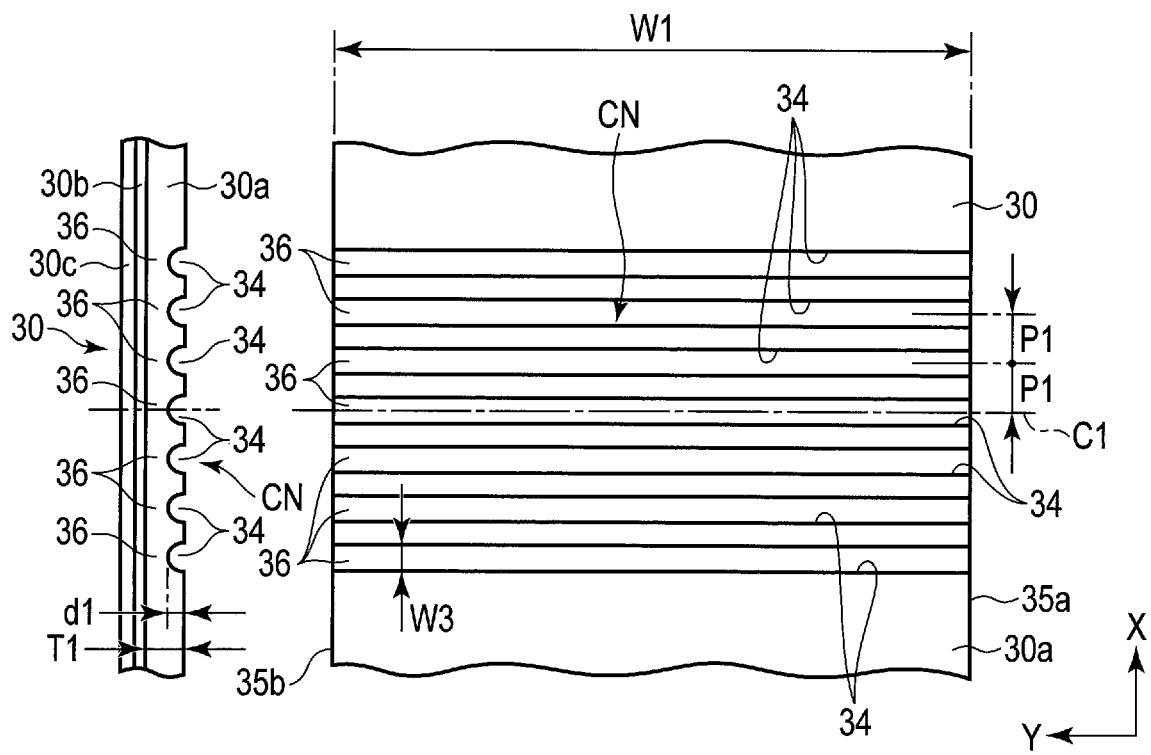
F I G. 11B    F I G. 11A
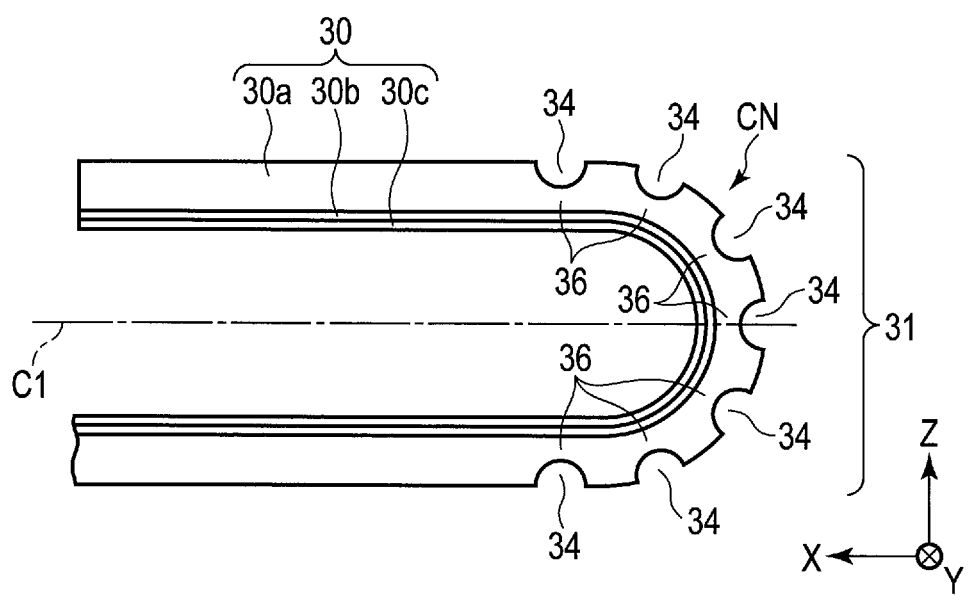
F I G. 12

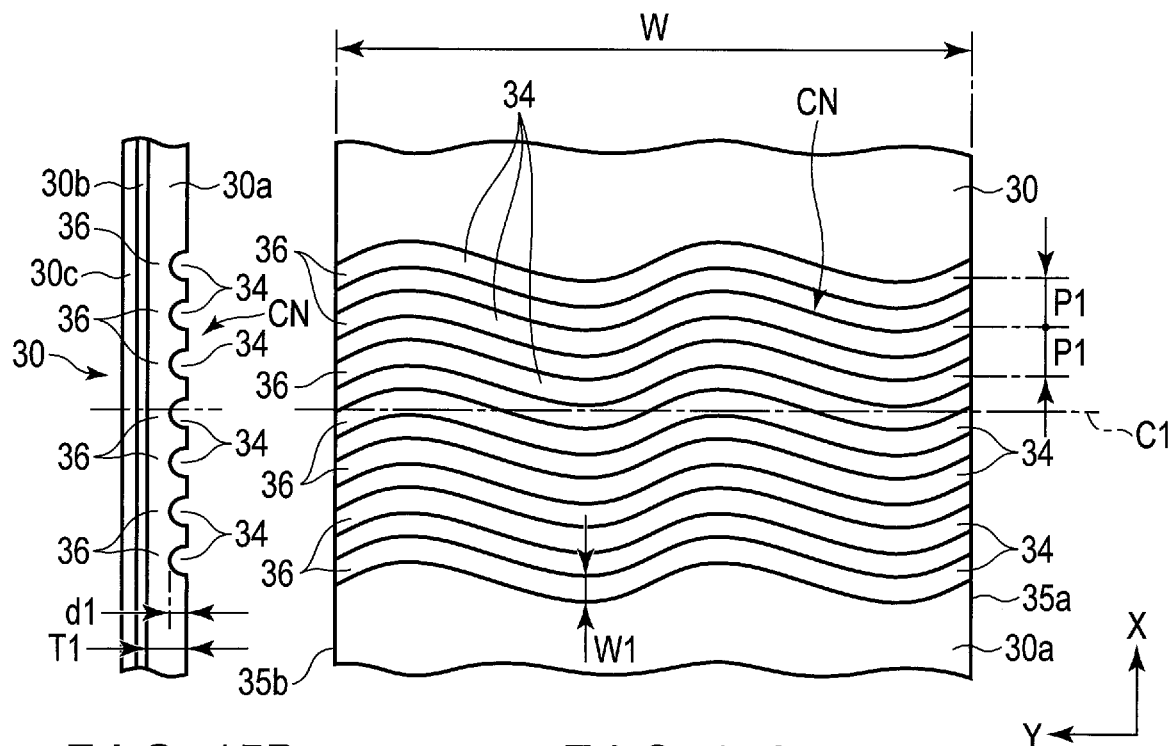
F I G. 15B    F I G. 15A
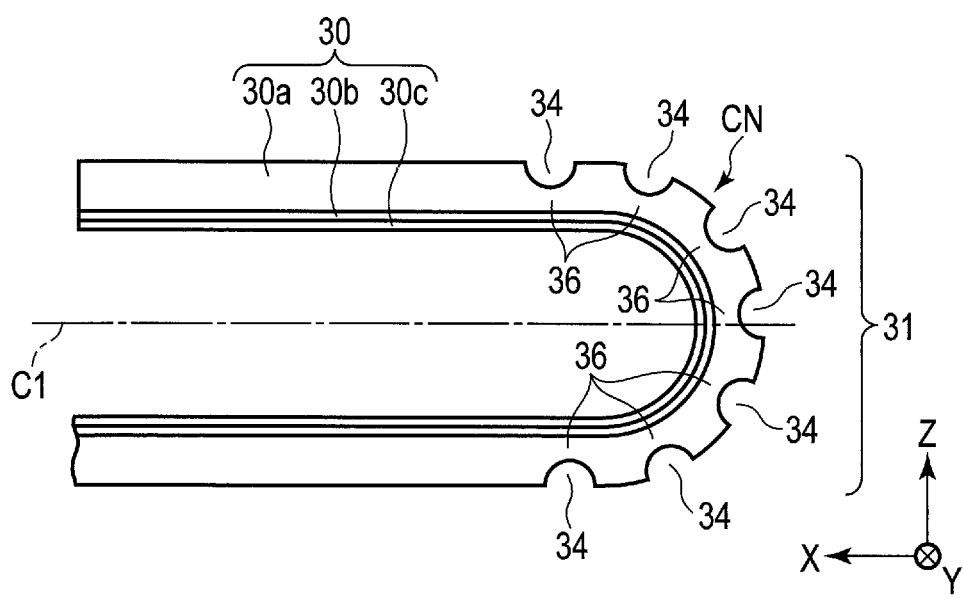
F I G. 16

DISPLAY DEVICE AND FLEXIBLE WIRING BOARD

CROSS-REFERENCE TO RELATED APPLICATIONS

This application is based upon and claims the benefit of priority from Japanese Patent Application No. 2018-022321, filed Feb. 9, 2018, the entire contents of which are incorporated herein by reference.

FIELD

Embodiments described herein relate generally to a display device and a flexible wiring board.

BACKGROUND

Liquid crystal display devices and organic electroluminescent (EL) display devices are widely used as a display device of smartphones, tablet computers, vehicle-navigation systems, etc. For example, liquid crystal displays comprise a liquid crystal display panel and a backlight device which illuminates the liquid crystal display panel. The backlight device includes a case (or bezel) attached to the liquid crystal display panel, and various optical members accommodated in the case. A driver IC is mounted near an input terminal of the liquid crystal display panel. Further, a flexible printed circuit (FPC) is jointed to the liquid crystal display panel and is electrically connected to the driver IC. The FPC is extends outward from the liquid crystal display panel and is bent, for example, toward a bottom surface side of the case to be placed along a side surface and a rear surface of the case.

In recent years, narrowing a frame in display devices is progressing. For example, a driver IC is mounted on an FPC, and thus a driver IC conventionally mounted on a display panel is omitted, thereby achieving the narrowing the frame of the display panel. An FPC mounted with a driver IC, which is referred to as COF hereinafter, requires to increase the thickness of a substrate (a sheet-shaped base material, for example, polyimide) to enhance the mechanical strength as a COF. Such COF has a resilience (elastic restoring force) against bending that is stronger than that of the ordinary FPC without a driver IC. On the other hand, as narrowing the frame of display devices progresses, steep bending of the COF is required. Thus, the curvature of the bent portion of the COF becomes large, and that causes the resilience of the COF to be further stronger. Under narrowing the frame of display devices, suppressing such resilience is required.

SUMMARY

The present application generally relates to a display device and a flexible wiring board.

According to one embodiment, a display device includes a display panel, a case including a bottom plate and a side plate provided on the bottom plate and attached to the display panel, and a flexible wring board including a first end joined to the display panel and extending from the display panel toward the bottom plate while being curved around the side plate. The flexible wring board includes a substrate, a conductive layer on a first surface of the substrate and constituting wires, and a protective layer overlaid on the conductive layer and the substrate and opposed to an outer surface of the case. The flexible wring board includes a curved portion curved along the side plate, and the substrate includes a concavity provided in the curved portion.

BRIEF DESCRIPTION OF THE DRAWINGS

FIG. 3 is an exploded perspective view of the liquid crystal display device.

FIG. 4 is a cross sectional view showing a light source-side end of the liquid crystal display device taken along line A-A of FIG. 2.

FIG. 5A is a plan view showing a flexible wiring board when developed.

FIG. 5B is a side view showing the flexible wiring board when developed.

FIG. 6 is a side view showing the flexible wiring board when curved.

FIG. 7A is a plan view of a flexible wiring board according to a second embodiment.

FIG. 7B is a side view of the flexible wiring board according to the second embodiment.

FIG. 8 is a side view showing the flexible wiring board according to the second embodiment when curved.

FIG. 11A is a plan view of a flexible wiring board according to a fourth embodiment.

FIG. 11B is a side view of the flexible wiring board according to the fourth embodiment.

FIG. 12 is a side view showing a flexible wiring board according to the fourth embodiment when curved.

FIG. 15A is a plan view of a flexible wiring board according to a sixth embodiment.

FIG. 15B is a side view of the flexible wiring board according to the sixth embodiment.

FIG. 16 is a side view showing the flexible wiring board according to the sixth embodiment when curved.

DETAILED DESCRIPTION

Figure 1:
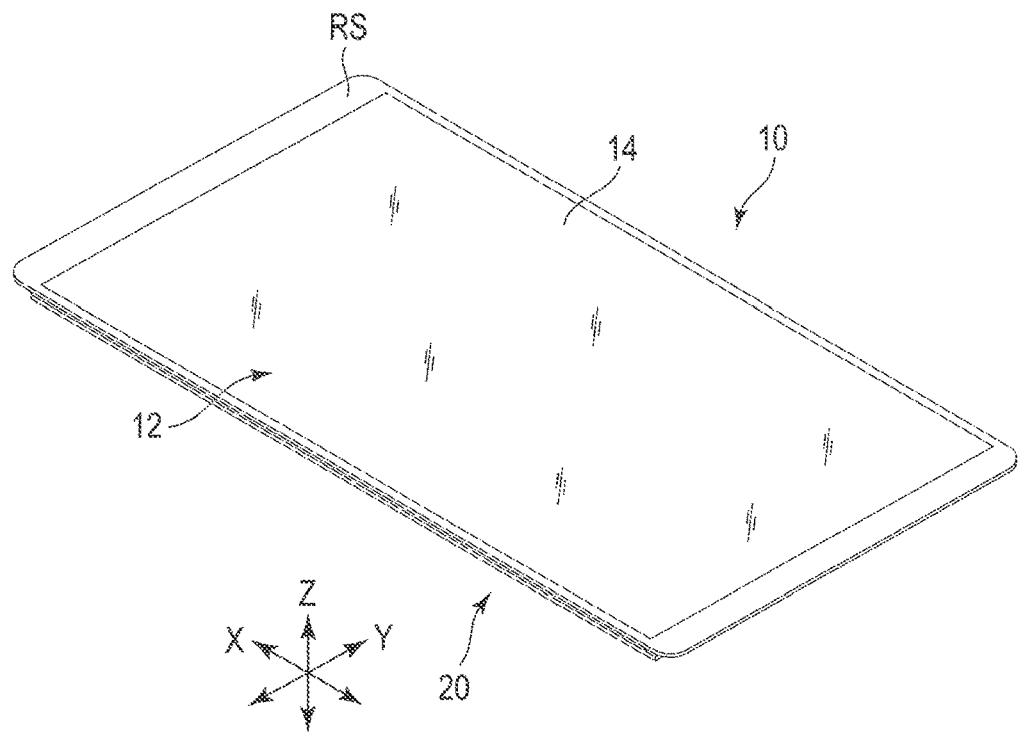
FIG. 1 is a perspective view showing a liquid crystal display device according to a first embodiment from a display surface side.

Various embodiments will be described hereinafter with reference to the accompanying drawings. In general, according to one embodiment, a display device comprises a display panel; a case comprising a bottom plate opposing a rear surface of the display panel and a side plate provided on the bottom plate and attached to the display panel; and a flexible wring board including one end joined to the display panel and extending from the display panel toward the bottom plate while being curved around the side plate of the case. The flexible wring board comprises a sheet-shaped substrate, a conductive layer formed on a first surface of the substrate and constituting wires, and a protective layer overlaid on the conductive layer and the substrate and opposing an outer surface of the case. The flexible wring board includes a curved portion curved along the side plate, and the substrate comprises a concavity provided in the curved portion. The concavity comprises a bottom portion provided closer to the first surface and opened towards a second surface of the substrate, which is opposite to the conductive layer through the first surface.

The disclosure is merely an example, and proper changes in keeping with the spirit of the invention, which are easily conceivable by a person with ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

First Embodiment

Figure 2:
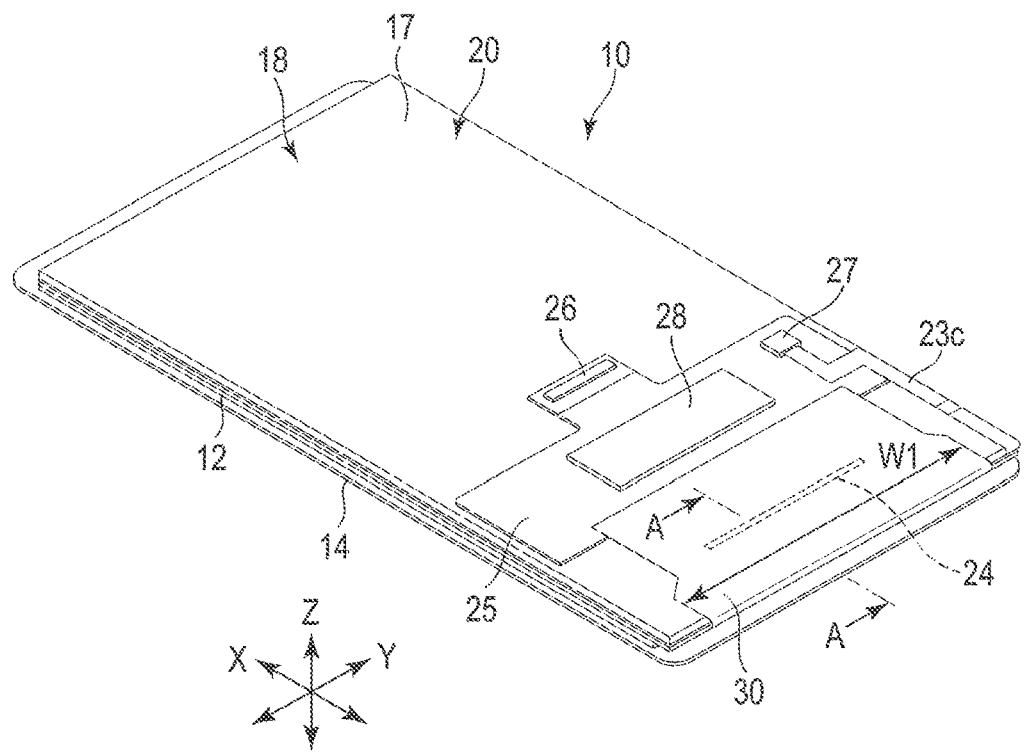
FIG. 2 is a perspective view showing the liquid crystal display device from a rear surface side.

FIG. 1 is a perspective view of a liquid crystal display device according to the first embodiment from a display surface side. FIG. 2 is a perspective view of the liquid crystal display device from a rear surface side. FIG. 3 is an exploded perspective view of the liquid crystal display device. FIG. 4 is a cross sectional view of a light source-side end of the liquid crystal display device, taken along line A-A of FIG. 2.

A liquid crystal display 10 can be used, for example, to be installed in various kinds of electronic devices such as smart phones, tablet devices, cellular phones, notebook personal computers, handheld game machines, electronic dictionaries, television sets and car-navigation systems.

As shown in FIGS. 1, 2 and 3, the liquid crystal display 10 comprises an active-matrix type liquid crystal display panel (display panel) 12, a cover panel 14 overlaid on a display surface 12a, which is one main surface of the display panel 12, to cover the entire display surface 12a, and a backlight unit (backlight device) 20 opposed to a rear surface, which is the other main surface of the display panel 12.

As shown in FIGS. 3 and 4, the display panel 12 comprises a first substrate SUB1 of a rectangular-plate shape, a second substrate SUB2 of a rectangular-plate shape opposed to the first substrate SUB1, and a liquid crystal layer LQ provided between the first substrate SUB1 and the second substrate SUB2. Each of the first substrate SUB1 and the second substrate SUB2 is formed of a transparent insulating substrate such as a glass plate or resin plate. The peripheral portion of the second substrate SUB2 is adhered to the first substrate SUB1 with a seal SE. A polarizer PL2 is adhered to the surface of the second substrate SUB2 and forms the display surface 12a of the display panel 12. A polarizer PL1 is adhered to the surface of the first substrate SUB1 (the rear surface of the display panel 12).

The display panel 12 has a display area (active region) DA of a rectangular shape in a region encircled by the seal SE in a state where the display surface 12a is seen in plan view (the state of viewing the display panel from the normal direction of the surface of the display panel, as so will be hereinafter). Images are displayed on the display area DA. A rectangular frame area (non-display area) ED is provided around the display area DA. The display panel 12 has a transmissive display function which displays images in the display area DA by selectively transmitting the light from the back light unit 20 through the display area DA.

The cover panel 14 is formed of, for example, a glass or acrylic transparent resin, into a rectangular plate shape. In a peripheral portion of the rear surface of the cover panel 14 (a surface on a side of the display panel 12 or a surface on an opposite side to the surface opposing the user), a frame-shaped light-shielding layer RS is formed. The rear surface (back surface) of the cover panel 14 is adhered onto the polarizer PL2 of the display panel 12 with a light-transmitting adhesives AD or tacking agent.

As shown in FIGS. 2, 3 and 4, the backlight unit 20 comprises a case 18, a plurality of optical members (not shown) disposed in the case 18, and a light source unit 22 which supplies light entering the optical members. In this embodiment, the case 18 comprises a bottom plate 17 of a rectangular shape, a plurality of side plates (16a to 16d) standing on side edges of the bottom plate 17, and a frame 15 of a rectangular-frame shape provided in tight contact with these side plates. The frame 15 and the side plates constitute a pair of long side plates 16a and 16b extending in the long side direction of the display panel 12 and opposing each other, and a pair of short side plates 16c and 16d extending in the short side direction of the display panel 12 and opposing each other.

The frame 15 and the side plates 16a to 16d and bottom plate 17 can be formed integrally as one body each from a resin or metal, or such a structure that one of these is made from a resin and the other is made from a metal can be adopted as well. In this embodiment, the bottom plate 17 and the side plates 16a to 16d are formed from a metal such as stainless steel (SUS), and the frame 15 is formed from a resin. The frame 15 is integrated with the side plates 16a to 16d by insertion molding or the like.

As shown in FIG. 3, the backlight unit 20 comprises a light guide (not shown) disposed in the case 18, an optical sheet OS provided on the light guide, and a light source unit 22 provided on a side of the light guide. The light source unit 22 comprises a circuit board 23 extending along the side plate 16d, and a plurality of light sources, for example, light-emitting diodes (LED) 21 mounted on the circuit board 23. The LEDs 21 emit light entering an incident surface of the light guide. The circuit board 23 comprises a connection end portion 23c, and the connection end portion 23c extends outward from the side plate 16d.

As shown in FIGS. 3 and 4, the backlight unit 20 comprises a double-sided tape TP1 having a frame-shape. The double-sided tape TP1 is adhered on the frame 15. An outer circumferential edge of the double-sided tape TP1 coincides with an outer circumferential edge of the case 18. As shown in FIG. 4, an inner circumferential portion of the double-sided tape TP1 is adhered to the polarizer PL1, and an outer circumferential portion is adhered to the first substrate SUB1 while interposing a spacer SP1 therebetween. The outer circumferential edge of the backlight unit 20 coincides the outer circumference edge of the first substrate SUB1 except for the light source side. In the light source side, a side edge of the backlight unit 20 is located on a slightly outer side from a side edge of the first substrate SUB1.

As shown in FIGS. 2, 3 and 4, the liquid crystal display 10 comprises a flexible wiring board (, which may be referred to as main flexible printed circuit (FPC)) joined to the display panel 12. On one short side of the first substrate SUB1, an exposed portion which does not overlap the second substrate SUB2 is provided, and a first end portion of the main FPC30 is joined to an upper surface of the exposed portion. The main FPC 30 extends outwards from a short side of the display panel 12. The main FPC 30 has a width W1 in the first end portion, which is less than a width W2 of the first substrate SUB1. The main FPC 30 extends out in a direction perpendicular to, for example, the short side of the first substrate SUB1.

As a signal supply source which supplies signals necessary to drive the display panel 12, the main FPC 30 is provided with a semiconductor device such as the driver IC 24 mounted thereon. (Note that the structure in which a driver IC is mounted on an FPC or a flexible wiring board may be referred to as Chip-On flexible printed circuit (COF).) A sub-FPC 25 is joined to a second end portion of the main FPC 23. On the sub-FPC 25, a capacitor C1, connectors 26 and 27 and the like are mounted.

As shown in FIGS. 2 and 4, the main FPC 30 is folded back along an end edge on the short side of the first substrate SUB1, and overlaid on the bottom plate 17 of the backlight unit 20. With this configuration, the first end portion side of the main FPC 30 that is on the display panel 12 side constitutes a curved portion 31 curved towards the bottom plate 17 side of the case 18 from the short side end of the display panel 12. A portion of the main FPC 30 is adhered onto the bottom plate 17 with a double-sided tape TP2. The sub-FPC 25 is overlaid on the bottom plate 17. The connection end portion 23c of the light source unit 22 is folded back along the side plate 16d of the case 18 and opposed to the bottom plate 17. The connection terminal of the connection end portion 23c is connected to the connector 27 on the sub-FPC 25.

FIGS. 5A and 5B are a plan view and a side view, respectively showing the main FPC when developed, and FIG. 6 is a side view showing the main FPC 30 when curved.

As shown in FIGS. 5A and 5B, the main FPC 30 is formed into a belt-shape having a width W1, which includes a first side edge 35a and a second side edge 35b opposing parallel to each other. The first and second side edges 35a and 35b may not necessarily be parallel to each other, but one side edge or both may be inclined. The main FPC 30 comprises a layered or sheet-shaped substrate 30a, a conductive layer 30b formed on a surface (first surface) of the substrate 30a and constituting a plurality of wires, contact pads and the like, and a protective layer 30c stacked on the conductive layer 30b and the substrate 30a to cover the conductive layer 30b. The substrate 30a and the protective layer 30c are formed from, for example, a synthetic resin such as polyimide or polyurethane, and the conductive layer 30b is formed from an electroconductive metal layer, for example, a copper foil. The thickness of the main FPC 30 may vary from one location to another, but, for example, a thickness T1 of the substrate 30a is 35 µm and the thickness of the entire structure thereof is about 52 µm.

The main FPC 30 includes a concavity CN formed in the other surface (second surface) of the substrate 30a (the surface on an opposite side to the conductive layer 30b). In the embodiment, the concavity CN includes, for example, a groove 34.

The concavity CN, that is, the groove 34 comprises a bottom surface (bottom portion) on a side of the conductive layer 30b in the substrate 30a, and is open to the second surface of the substrate 30a, which is opposite to the conductive layer 30b. In other words, the concavity CN comprises a bottom portion provided closer to the first surface and opened towards the second surface of the substrate 30a, which is opposite to the conductive layer 30b through the first surface.

The groove 34 linearly extends from the first side edge 35a to the second side edge 35b. Moreover, the groove 34 extends along a location of the apex of the curved portion 31, that is, along a central line C1 which is the center of the curvature. Here, the central line C1 extends in a direction perpendicular to the first and second side edges 35a and 35b. For example, the groove 34 is formed into approximately V-shape in cross section. A width W3 of the groove 34 is 25 to 100 µm, and a depth d1 of the groove 34 is adjusted to 10 to 25 µm if needed. In the substrate 30a, the region where the groove 34 is provided is formed thin, and more specifically, the thickness of the substrate 30a is reduced by a portion equivalent to the depth d1 of the groove 34, to form a thin portion (thin-walled portion) 36 whose thickness is less than that of the other regions of the main FPC 30. That is, the thin portion 36 is formed as a region between the bottom surface of the groove 34 and the first surface of the substrate 30a. The thickness of the thin portion 36 is expressed by (T1-d1), and is about 10 to 25 µm. The thickness of the thin portion 36 is set in consideration of the strength of the substrate 30a to such a thickness that the thin portion 36 is not cracked even if it is bent.

For example, the groove 34 can be formed by applying UV laser onto the surface of the substrate 30a in the atmosphere, to partially remove the substrate 30a or subjecting it to line processing. When using laser, it is naturally possible to process the groove 34 into the main FPC itself as a single body, or even in a state where the main FPC 30 is built in the display device.

As shown in FIGS. 4 and 6, the main FPC 30 is folded back on the groove 34 and the thin-walled portion 36 as its center, and constitutes a circularly curved portion 31. The main FPC 30 is disposed in a direction that a protective layer 30c side thereof opposes outer surfaces of the display panel 12 and the case 18. The protective layer 30C and the conductive layer 30b are located on an inner circumferential side of the curved portion 31, and the substrate 30a is located on an outer circumferential side of the curved portion 31. The groove 34 and the thin-walled portion 36 of the substrate 30a extends to the location of the apex (peak portion, the central line C1 of the bent portion) of the curved portion 31.

As shown in FIG. 4, a plurality of connection terminals 30d, which are formed of a part of the conductive layer 30b, are formed in the first end portion of the main FPC 30. By thermo-compressing the first end portion to the first substrate SUB1, the plurality of connection terminals 30d are electrically connected to the plurality of wires or terminals of the first substrate SUB1, respectively. The driver IC 24 is mounted on the protective layer 30c and is electrically connected to the wires of the main FPC 30 via openings or contact pads (not shown) provided in the protective layer 30c. On the second end portion of the main FPC 30, a plurality of connection terminals (not shown), which are formed of a part of the conductive layer 30b, are provided. By thermo-compressing the second end portion to the sub-FPC 25 (see FIG. 3), the plurality of connection terminals are electrically connected to the sub-FPC 25. As described above, a part of the main FPC 30, that is, the regional portion opposing the bottom plate 17 and adjacent to the curved portion 31 is adhered to the bottom plate 17 by the double-sided tape TP2. Thus, the curved portion 31 of the main FPC 30 is held in a curved state.

Note that in view of the actual condition of the remarkably slimmed display device of the recently years, the state discussed in this embodiment, where the main FPC 23 and the like are curved along the case 18 may be regarded to be equivalent to the state where the main FPC 23 is bent along the case 18. Therefore, the expression "curvature" used in this embodiment covers the bent state where an object is bent or folded, and similarly the expression "bending" also covers the curved state where an object is curved at such a degree of curvature that it can be as well regarded to be equivalent to "being bent".

According to the liquid crystal display and the main FPC of the first embodiment configured as described above, a concavity CN, for example, a groove 34 is formed in the substrate 30a of the main FPC 30 to prepare the thin portion 36, and further the main FPC 30 is bent on the groove 34 and the thin portion 36 as a center, to form the curved portion 31. With the groove 34 and the thin portion 36 as such, the main FPC 30 can be easily bent, and further the resilience of the main FPC 30 generated by bending can be reduced. Therefore, the breaking of the joint between the backlight unit 20 and the display panel 12, detachment of the double-sided tape TP2, detachment of internal parts of the backlight unit 20, and the like, which may be caused by the resilience of the main FPC 30 can be inhibited, thereby making it possible to improve the reliability of the display device. Further, the main FPC 30 can be bent even more steeply (the main FPC can be bent at a greater curvature), and therefore the main FPC 30 can be adopted for further thinner display devices.

As described above, according to the first embodiment, a display device and a flexible wiring board which can improve the reliability and reduce the manufacturing cost can be provided.

Note that in the first embodiment, the liquid crystal display panel 12 is used for the display panel of the display device, but the display panel is not limited to this. For example, an organic electroluminescent display panel may be used as well. In this case, a backlight unit is not necessary, and the case 18 can be disposed on a rear surface side of the organic electroluminescence display panel. Moreover, the groove 34 and the thin portion 36 of the main FPC 30 are formed into a linear shape which extends continuously in its width direction, but the structure is not limited to this. For example, the groove and the thin portion may be formed into a dashed line shape which extends in the width direction.

Next, a flexible wiring board of a display device according to another embodiment will now be described. In other embodiments described below, the same referential marks are given to the same parts as those of the first embodiment discussed above, the detailed explanation is omitted or simplified, and they describes in detail focusing on different parts from the first embodiment.

Second Embodiment

FIGS. 7A and 7B are respectively a plan view and a side view showing a developed main FPC according to a second embodiment and FIG. 8 is a side view showing the main FPC when curved, of the second embodiment.

As shown, according to the second embodiment, a groove 34 which constitutes a concavity CN of a main FPC 30 extends continuously and linearly from a first side edge 35a to a second side edge 36b. A width W3 of the groove 34 is greater than the width of the groove 34 in the first embodiment. A bottom surface of the groove 34 is formed into a circularly curved surface. A depth d1 of a deepest region of the groove 34 is 10 to 25 µm. In a substrate 30a, a region where the groove 34 is formed by partially removing the substrate 30a into a thin layer and thus a thin portion (thin-walled portion) 36 which is thinner than the other regions is formed.

For example, the groove 34 is formed by applying UV laser onto a surface of the substrate 30a while maintain the laser out of focus, to remove the substrate 30a broadly and gently in slope.

In the second embodiment, the other structures of the main FPC 30 are the same as those of the main FPC 30 of the first embodiment.

According to the second embodiment, the bottom surface of the groove (concavity) 34 is form into an arc shape, and with this structure, when bending the main FPC 30, concentration of stress on the thin-walled portion 36 can be relaxed. In addition, also in the second embodiment, advantages similar to those of the above-described first embodiment can be obtained.

Third Embodiment

Figures 9A, 9B:
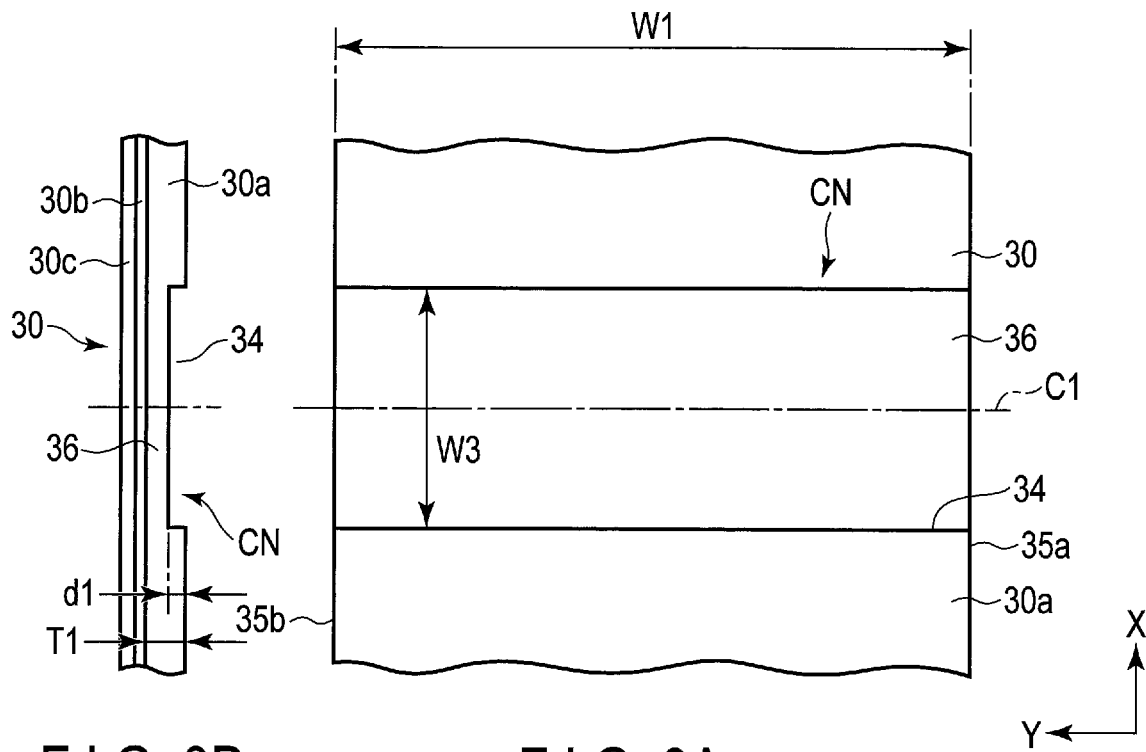
FIG. 9A is a plan view of a flexible wiring board according to a third embodiment.
FIG. 9B is a side view of the flexible wiring board according to the third embodiment.
Figure 10:
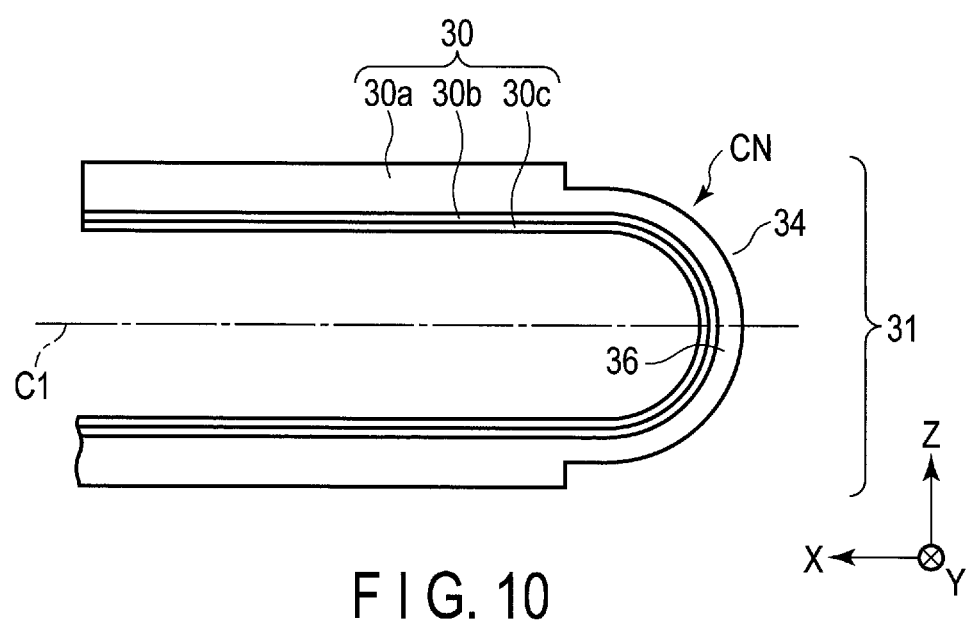
FIG. 10 is a side view showing the flexible wiring board according to the third embodiment when curved.

FIGS. 9A and 9B are respectively a plan view and a side view showing a developed main FPC according to a third embodiment, and FIG. 10 is a side view showing the main FPC when curved, of the third embodiment.

As shown according to the third embodiment, a groove 34 which constitutes a concavity CN of a main FPC 30 extends continuously and linearly from a first side edge 35a to a second side edge 36b. A width W3 of the groove 34 is greater than the width of the groove 34 of the first embodiment, and the groove 34 has such a width that it extends over a full length of a curved portion 31 thereof. That is, the groove 34 is formed to have a width expand over an entire region of the curved portion 31 including one end of the curved portion 31 on a display panel side and the other end of the curved portion 31 on a bottom plate side of the case. In other words, the groove 34 is formed to have a width expanded over an entire region of the curved portion 31 including one end closer to the display panel and the other end closer to the bottom plate of the case. A bottom surface of the groove 34 is formed into a flat surface parallel to the surface of the substrate 30a. The groove 34 has a uniform depth d1 over the entire width W3 of the groove 34 (, which is, for example, 10 to 25 µm).

The groove 34 described above can be formed by etching or $O_2$-ashing. For example, in $O_2$-ashing, plasma is generated in vacuum and $O_2$ is made to strike at the surface of the substrate 30a to bind carbon in the substrate (polyimide) and $O_2$ together into carbon dioxide to be removed.

In the substrate 30a, the region where the groove 34 is formed into a thin portion by partially removing the substrate 30a, and thus the thin portion (thin region) 36 layer whose thickness is less than those of the other regions is formed. In this embodiment, the thin portion 36 is formed to extend over an entire length of the curved portion 31. The thin portion 36 has a uniform layer thickness (T1-d1) over the entire region thereof.

In the third embodiment, the other structures of the main FPC 30 are the same as those of the main FPC 30 of the first embodiment.

According to the third embodiment, the entire region of the curved portion 31 is formed into the thin-walled portion (thin portion) 36, and thus the entire curved portion 31 can be reduced in stiffness and be easily bendable. Further, the resilience of the main FPC 30, which is generated by bending, can be further reduced. Furthermore, the depth d1 of the groove 34, or the thickness of the thin portion 36 is made uniform over the entire region of the curved portion 31, and thus concentration of stress on the curved portion 31 can be relaxed regardless of the curvature of the curved portion 31. In addition, effects similar to those of the first embodiment can be obtained in the third embodiment.

Fourth Embodiment

FIGS. 11A and 11B are respectively a plan view and a side view of the main FPC when developed, and FIG. 12 is a side view showing of the main FPC when curved.

As shown, according to the fourth embodiment, a main FPC 30 comprises, in a curved portion 31, a plurality of grooves 34 formed in a substrate 30a. The plurality of grooves 34 constitute one concavity CN in the substrate 30a. The grooves 34 each extend continuously and linearly in a width direction of the substrate 30a from a first side edge 35a to a second side edge 35b. Moreover, one groove 34 extends along a location of the apex of the curved portion 31 (a central line C1 of curvature), that is, along a central line C1 which is the center of the curvature. The other grooves 34 are provided on one or both sides of the apex. For example, a width W3 of each groove 34 is 25 to 100 µm, and a depth d1 of the groove 34 is 10 to 25 µm. The grooves 34 have the same width W3 and depth d1. Moreover, the grooves 34 are arranged at a constant pitch P1. The grooves 34 are provided at constant intervals over substantially the entire region of the curved portion 31. Note that the grooves 34 can be formed by, for example, liner processing using UV laser.

In the substrate 30a, regions where the grooves 34 are provided are formed thin, and more specifically, the thickness is reduced by a portion equivalent to the depth d1 of the grooves 34, to form thin portions (thin-walled portions) 36 whose thickness is less than that of the other regions of the main FPC 30. Thus, these thin portions are formed to respectively correspond to the grooves. The grooves 34 and the thin portions 36 are provided at constant interval over the entire region of the curved portion 31, that is, the entire region of the curved portion 31 which includes one end of the curved portion 31 on a display panel side and the other end on side of a bottom plate of the case.

In the fourth embodiment, the other structures of the main FPC 30 are the same as those of the main FPC 30 of the first embodiment.

According to the fourth embodiment, substantially the entire region of the curved portion 31 are formed with a concavity CN including the grooves 34 and the plurality of thin portions 36, and thus the entire curved portion 31 can be reduced in the stiffness and can be easily bendable. Thus, the resilience of the main FPC 30, which is generated by bending, can be further reduced. Furthermore, with the plurality of grooves 34 and thin portions 36 thus provided, the concentration of stress on the curved portion 31 can be relaxed, thereby making it possible to improve the durability of the curved portion 31. In addition, effects similar to those of the first embodiment can be obtained in the fourth embodiment.

Note that in the fourth embodiment, the width W1 and the depth d1 of the grooves 34 may not be all the same as each other, but such a structure may as well be adopted that the width and depth may vary from one groove to another. The pitch P1 of the grooves 34 is not limited to be constant, but it may be varied from one location to another.

Fifth Embodiment

Figures 13A, 13B:
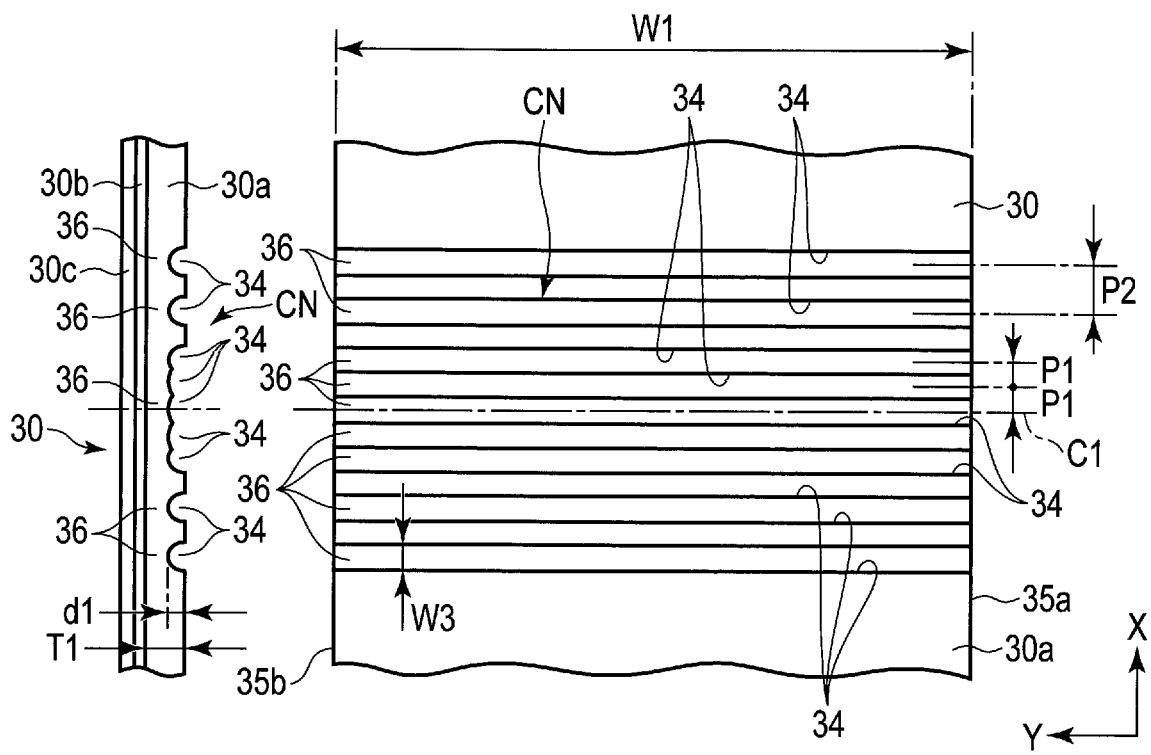
FIG. 13A is a plan view of a flexible wiring board according to a fifth embodiment.
FIG. 13B is a side view of the flexible wiring board according to the fifth embodiment.
Figure 14:
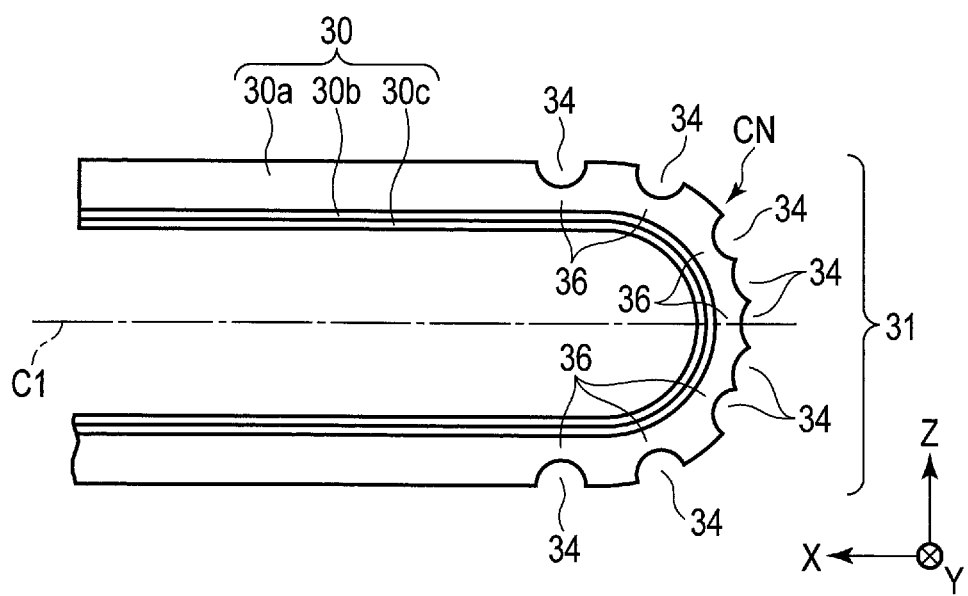
FIG. 14 is a side view showing the flexible wiring board according to the fifth embodiment when curved.

FIGS. 13A and 13B are respectively a plan view and a side view of a main FPC when developed, and FIG. 14 is a side view of the main FPC when curved.

As shown, according to the fifth embodiment, a substrate 30a of a main FPC 30 comprises a concavity CN which includes a plurality of grooves 34 formed in a curved portion 31. The grooves 34 each extend continuously and linearly in a width direction of the substrate 30a from a first side edge 35a to a second side edge 36b. Moreover, one groove 34 extends along a location of the apex of the curved portion 31. The other grooves 34 are provided on one or both sides of the apex. For example, a width W3 of each groove 34 is 25 to 100 µm, and a depth d1 of the groove 34 is 10 to 25 µm. The plurality of grooves 34 have the same width W3 and depth d1.

The groove 34 is formed along the location of the apex of the curved portion 31, and a plurality of, for example, two of those formed on both sides of the groove 34 are provided at a narrow pitch P1. Further, a plurality of, for example, two grooves 34 are provided on each of both sides of the grooves 34 formed at a pitch P2, which is greater than the pitch P1. For example, the pitch P1 is 0.025 mm and the pitch P2 are 0.1 mm.

The plurality of grooves 34 arranged at the pitch P1 are formed so that each adjacent pair of grooves 34 partially overlap each other. Thus, bottom surfaces of these grooves 34 extend continuously to each other, thus a substantially flat continuous bottom surface is formed. The plurality of grooves 34 can be formed by, for example, linear processing using UV laser.

In the substrate 30a, regions where the grooves 34 are provided are formed thin, and more specifically, the thickness is reduced by a portion equivalent to the depth d1 of the grooves 34, to form thin portions (thin-walled portions) 36 whose thickness is less than that of the other regions of the main FPC 30. Thus, these thin-walled portions 36 are formed to respectively correspond to the grooves 34. According to this embodiment, the plurality of grooves 34 provided near the apex of the curved portion 31 are formed to partially overlap each other. With this structure, the thin-walled portions 36 corresponding to these grooves 34 extend to continued to each other, thus forming the wide thin-walled portions 36 including the apex.

In the fifth embodiment, the other structures of the main FPC 30 are the same as those of the main FPC 30 of the first embodiment.

According to the fifth embodiment, substantially the entire region of the curved portion 31, that is, the entire region of the curved portion 31 from one end of the curved portion 31 on a display panel side to the other end on side of a bottom plate of the case, is formed from the concavity CN, that is, the grooves 34 and the plurality of thin portions 36. Thus the entire curved portion 31 can be reduced in the stiffness and can be easily bendable. Further, the resilience of the main FPC 30, which is generated by bending, can be further reduced. The thin portions 36 are formed to extend over a wide region including the apex of the curved portion 31, so that the region near the apex of the curved portion 31 can be made easily bendable. Even when the curved portion 31 is bent steeply, the concentration of stress on the vicinity of the apex can be relaxed. In addition, effects similar to those of the first embodiment can be obtained in the fifth embodiment.

Sixth Embodiment

FIGS. 15A and 15B are respectively a plan view and a side view of a main FPC when developed, and FIG. 16 is a side view of the main FPC when curved.

As shown, according to the fifth embodiment, a substrate 30a of a main FPC 30 comprises a plurality of grooves 34 which constitute a concavity CN in a curved portion 31. The grooves 34 each extend continuously in a width direction of the substrate 30a from a first side edge 35a to a second side edge 35b. Each groove 34 curves a plurality of times between the second side edge 35b and the first side edge 35a. For example, each groove 34 is formed into a wave form which curves a plurality of times up and down.

One groove 34 extends along a location of the apex of the curved portion 31. The other grooves 34 are provided on both sides of the apex and the rest on the other side. The grooves 34 have a width W3 and a depth d1 which are the same as each other. The grooves 34 are arranged at a constant pitch P1. The grooves 34 are provided at a constant interval over substantially the entire region of the curved portion 31. Note that these grooves 34 can be formed by, for example, linear processing using UV laser.

In the substrate 30a, regions where the grooves 34 are provided are formed thin, and more specifically, the thickness is reduced by a portion equivalent to the depth d1 of the grooves 34, to form thin portions (thin-walled regions) 36 whose thickness is less than that of the other regions of the main FPC 30. Thus, these thin portions 36 are formed to respectively correspond to the grooves 34. The thin portions 36 respectively corresponding to the groove 34s extend to curve a plurality of times into a wave form. The thin portions 36 are arranged at a constant interval over substantially the entire region of the curved portion 31.

In the sixth embodiment, the other structures of the main FPC 30 are the same as those of the main FPC 30 of the first embodiment.

According to the sixth embodiment, substantially the entire region of the curved portion 31, that is, the entire region of the curved portion 31 including one end of the curved portion 31 on a display panel side to another end on side of a bottom plate of the case, is formed from the concavity CN including the grooves 34 and the thin portions 36. Thus the entire curved portion 31 can be reduced in the stiffness and can be easily bendable. Further, the resilience of the main FPC 30, which is generated by bending, can be further reduced. The thin portions 36 each extend to curve a plurality of times into a wave form, and thus the thin portions 36 extend to overlap the apex (central line C1 of the curvature) of the curved portion 31. With the plurality of thin portions 36, the concentration of stress on the apex of the curved portion 31 can be relaxed. Therefore, regardless of the curvature of the curved portion 31, the concentration of stress on the apex of the curved portion 31 can be relaxed, and the durability of the curved portion 31 can be improved.

In the sixth embodiment, the form of all the grooves 34 is not limited to wavy, but such a structure may as well be adopted that some of the grooves 34 provided in the region including the apex of the curved portion 31 are formed wavy, whereas others provided in the locations spaced apart from the apex are formed to extend linear.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Based on the structures which have been described in the above-provided embodiments and modification, a person having ordinary skill in the art may achieve structures with arbitral design changes; however, as long as they fall within the scope and spirit of the present invention, such structures are encompassed by the scope of the present invention. For example, the structural members of the display panel and the backlight device and the outer and inner shapes of the frame are not limited to rectangular, but one or both of the outer and inner shapes may be in some other shape, for example, polygonal, circular, elliptical, a combination of any of these or the like when seen in plan view. The display devices are not limited to a flat shape but may be partially or entirely curved or inclined. The materials of the structural members are not limited to those of the examples provided above, but may be selected from various options.

In a flexible wiring board, a curved portion may be formed not only in one location, but in a plurality of locations. In other words, such a structure may as well be adopted that a flexible wiring board is bends at a plurality of locations. In this case, it suffices if a groove (concavity) and a thin portion discussed above is provided in each curved portion. Moreover, the angle of the curvature of the curved portion is not limited to 180 degrees, but it may be set at any other angle.

In the second to sixth embodiments described above, the grooves 34 and the thin portions 36 of the main FPC 30 are formed to extend linear or wavy continuously along the width direction, but the form is not limited to this. For example, the grooves and thin portions may be formed into a dashed line manner which extends in the width direction.

Furthermore, regarding the present embodiments, any advantage and effect those will be obvious from the description of the specification or arbitrarily conceived by a skilled person are naturally considered achievable by the present invention.

What is claimed is:
1. A display device comprising:
a display panel;
a case comprising a bottom plate opposing a rear surface of the display panel and a side plate provided on the bottom plate and attached to the display panel; and
a flexible wring board including one end joined to the display panel and extending from the display panel toward the bottom plate while being curved around the side plate of the case, the flexible wring board comprising a sheet-shaped substrate, a conductive layer formed on a first surface of the substrate and constituting wires, and a protective layer overlaid on the conductive layer and the substrate and opposing an outer surface of the case,
the flexible wring board including a curved portion curved along the side plate, and
the substrate comprising a concavity dented at the curved portion, the concavity comprising a bottom portion provided closer to the first surface and opened towards a second surface of the substrate, which is opposite to the conductive layer through the first surface.
2. The display device of claim 1, wherein
the flexible wring board including a first side edge and a second side edge, extending in a curving direction of the curved portion, and the concavity is provided from the first side edge to the second side edge.

3. The display device of claim 2, wherein
the concavity comprises one or a plurality of grooves having a cross section of a circular shape or V-shape, formed in the second surface on an opposite side to the conductive layer.

4. The display device of claim 3, wherein
the grooves extend linearly from the first side edge to the second side edge in the curved portion.

5. The display device of claim 3, wherein
the grooves extend from the first side edge to the second side edge in a wave form in the curved portion, and at least a part of the grooves overlaps a central portion of curvature of the curved portion.

6. The display device of claim 1, wherein
the curved portion includes a first end on a side of the display panel and a second end on a side of the case in the flexible wring board, and the concavity has a width over an entire region of the curved portion, which includes the first and second ends, and the bottom portion is formed flatly.

7. The display device of claim 1, wherein
the concavity comprises one or a plurality of grooves extending in a direction which intersects a curving direction of the curved portion.

8. The display device of claim 7, wherein
the grooves are arranged in the curving direction at a constant pitch.

9. The display device of claim 7, wherein
a first group of grooves, which includes the one groove, are arranged at a first pitch, and a second group of grooves, which are located on both sides of the first group, are arranged at a second pitch which is greater than the first pitch.

10. A flexible wiring board comprising:
a sheet-shaped substrate;
a conductive layer formed on a first surface of the substrate and constituting wires; and
a protective layer overlaid on the conductive layer and the substrate,
the flexible wiring board being bendable to form a curved portion, and
the substrate comprising a concavity dented at a position corresponding to the curved portion.

11. The wiring board of claim 10, further comprising a first side edge and a second side edge extending to oppose each other,
wherein the concavity comprises a groove provided from the first side edge to the second side edge in the curved portion.

12. The wiring board of claim 11, wherein
the substrate comprises one or a plurality of grooves formed in a second surface on an opposite side to the conductive layer and constituting the concavity, and a thin portion whose thickness is less than those of other regions of the substrate, which is formed between a bottom of the one or plurality of grooves and the first surface of the substrate.

\* \* \* \* \*